United States Patent
Shafai et al.

(10) Patent No.: US 11,061,059 B2
(45) Date of Patent: Jul. 13, 2021

(54) TORSIONAL MOVING ELECTRIC FIELD SENSOR WITH MODULATED SENSITIVITY AND WITHOUT REFERENCE GROUND

(71) Applicants: Cyrus Shafai, Winnipeg (CA); Janaranjana Sampath Hiniduma Liyanage, Winnipeg (CA)

(72) Inventors: Cyrus Shafai, Winnipeg (CA); Janaranjana Sampath Hiniduma Liyanage, Winnipeg (CA)

( * ) Notice: Subject to any disclaimer, the term of this patent is extended or adjusted under 35 U.S.C. 154(b) by 365 days.

(21) Appl. No.: 16/185,159

(22) Filed: Nov. 9, 2018

(65) Prior Publication Data
US 2019/0137555 A1    May 9, 2019

Related U.S. Application Data

(60) Provisional application No. 62/583,856, filed on Nov. 9, 2017.

(51) Int. Cl.
*G01R 29/12* (2006.01)
*G01R 33/028* (2006.01)

(52) U.S. Cl.
CPC ......... *G01R 29/12* (2013.01); *G01R 33/0286* (2013.01)

(58) Field of Classification Search
CPC ...... G01R 29/12; G01R 33/02; G01R 33/028; G01R 33/0286
See application file for complete search history.

(56) References Cited

U.S. PATENT DOCUMENTS

| | | | |
|---|---|---|---|
| 6,177,800 B1 | 1/2001 | Kubby et al. | |
| 6,388,834 B1 | 5/2002 | Bernett et al. | |
| 6,965,239 B2 | 11/2005 | Yasuda et al. | |
| 7,242,882 B2 * | 7/2007 | Ichimura | G01R 29/12 324/458 |
| 8,653,813 B2 * | 2/2014 | Ettelt | G01R 33/028 324/244 |
| 9,594,128 B2 * | 3/2017 | Farghaly | G06F 30/17 |
| 2002/0162947 A1 * | 11/2002 | Weitekamp | G01R 29/12 250/214 R |
| 2006/0008284 A1 | 1/2006 | Ushijima et al. | |
| 2006/0076947 A1 * | 4/2006 | Berkcan | G01R 15/148 324/126 |
| 2008/0129302 A1 | 6/2008 | Shaifai et al. | |
| 2013/0002244 A1 * | 1/2013 | Quevy | G01R 33/0286 324/244 |

(Continued)

*Primary Examiner* — Huy Q Phan
*Assistant Examiner* — David B Frederiksen
(74) *Attorney, Agent, or Firm* — Ryan W. Dupuis; Kyle R. Satterthwaite; Ade & Company Inc.

(57) ABSTRACT

The present invention relates in general to a novel microelectromechanical sensor device for detecting and measuring electric field and magnetic field. In particular, the sensor device of the present invention is useful for measuring low and high strength electric fields and magnetic fields without reference ground connection, the device comprising a first electrode and a second electrode rigidly connected together via a joining segment so that the first electrode and second electrode are mutually and dependently pivotal about an axis passing through a joining segment to form a tiltable unit, and the first electrode and the second electrode are electrically isolated from each other. The present invention further provides novel methods of using through specific arrangement of such novel sensor device.

15 Claims, 8 Drawing Sheets

(56) References Cited

U.S. PATENT DOCUMENTS

| | | |
|---|---|---|
| 2013/0271113 A1 | 10/2013 | Shan et al. |
| 2016/0025666 A1* | 1/2016 | Ghionea ................ G01R 29/12 |
| | | 205/775 |
| 2016/0139173 A1* | 5/2016 | El-Gamal ............. B81B 3/0021 |
| | | 73/514.32 |
| 2018/0188336 A1* | 7/2018 | Laghi ................. G01R 33/0286 |
| 2018/0267294 A1* | 9/2018 | Aschwanden ..... G02B 26/0816 |

* cited by examiner

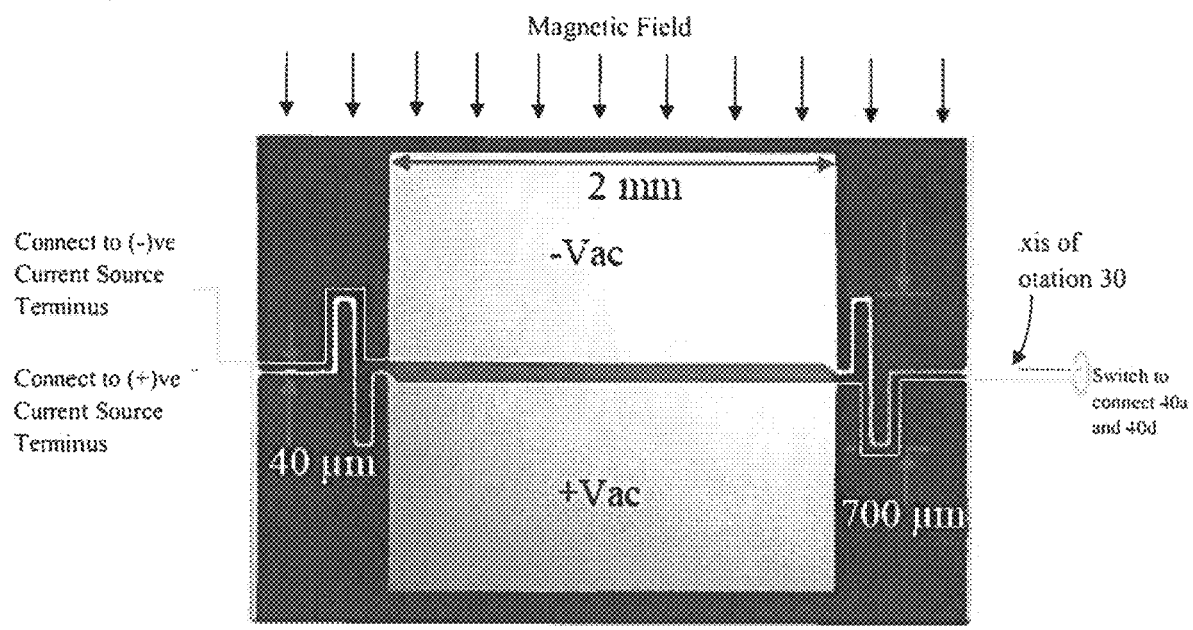

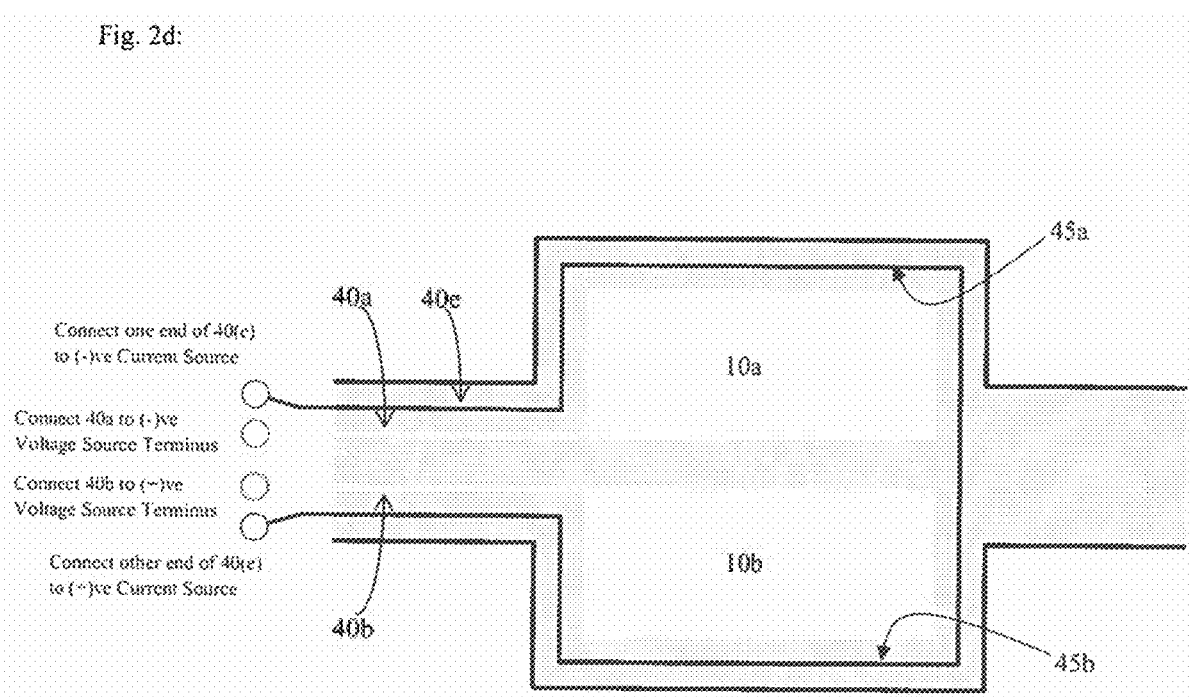

Fig. 5:
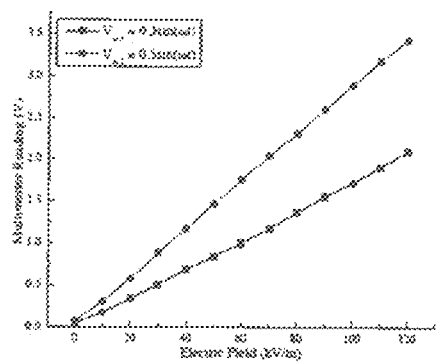 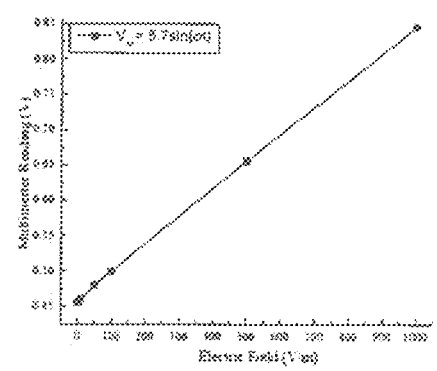
(a) (b)

TORSIONAL MOVING ELECTRIC FIELD SENSOR WITH MODULATED SENSITIVITY AND WITHOUT REFERENCE GROUND

This application claims the benefit under 35 U.S.C. 119(e) of U.S. provisional application Ser. No. 62/583,856, filed Nov. 9, 2017.

FIELD OF THE INVENTION

The present invention relates in general to a novel microelectromechanical electric field/potential sensor for measuring low and high strength electric fields without reference ground connection.

BACKGROUND

It is necessary to measure the electric fields or potential in diverse applications ranging from applications in meteorology, mass spectroscopy, image formation control, biomedicine, power line monitoring, to cathodic protection monitoring for underground pipelines and alike.

Electric field mills are the most common type of electric field or potential sensors (EFS), and many different types of electric field mills are used. For example, the rotating vane type electric field mills has been the instrument of choice in many applications for atmospheric science and electric power systems, but such typical electric field mills are bulky, expensive, power consuming, and require frequent maintenance.

More recently, miniature-scale EFSs based on microelectromechanical systems (MEMS) technology have been developed which are smaller, lighter, and more versatile, compared to the typical macro-scale electric field mills mentioned above. Correspondingly, the miniature EFSs are relatively more suitable for applications where electric field has fine spatial detail and spatial resolution is desired.

One type of such microelectromechanical EFSs (MEFS) is a variable capacitive coupling electric field/potential MEFS, and the basic operating principle for such an MEFS has been described in Hsu, C. H. and Muller, R. S., Solid State Sensors and Actuators, 1991, Digest of Technical Papers, Transducers, pp. 659-662, 1991; Horenstein, M. N. and Stone, P. R., "A microaperture electrostatic field mill based on MEMS technology," Journal of Electrostatics, vol. 5152, pp. 515-521, May 2001; C. Peng, X. Chen, Q. Bai, L. Luo, and S. Xia, "A novel high performance micromechanical resonant electrostatic field sensor used in atmospheric electric field detection," in Proceedings of the 19th IEEE Micro ElectroMechanical Systems Conference, MEMS 2006, Istanbul, Turkey, January 2006, pp. 698-701; U.S. Pat. No. 6,965,239; U.S. Pat. No Application No. 2006/0008284.

In brief, the operation of such an MEFS is based on using a grounded microshutter (or shielding electrode) to repeatedly shield and expose fixed sensor electrode(s), whereby exposing the sensor electrode(s) to the electric field results in a transfer of charges to the electrodes while shielding them discharges the sensor electrode(s). For the microshutter, MEFMs use a perforated plate which is electrically grounded through its mechanical support. The sensor electrode(s) are patterned over an insulating layer on substrate. Preferably, two sets of electrodes are often used for differential measurements which are exposed alternatively to the field.

The reciprocating movement of the grounded microshutter (or shielding electrode) can be actuated (or driven) by means such as capacitor-coupling based inter-digitated comb drives using electrostatic forces (as exemplified in U.S. Pat. No. 6,965,239) or by a combination of a magnet and an electrically-conductive microshutter using electromagnetic forces (as exemplified in U.S. Pat. No. 6,177,800) or electrothermal actuators (as exemplified in U.S. Pat. Application Publication No. US2008/0129302).

However, these conventional actuation means suffer from several distinct disadvantages. For example, large operating voltages are required for the inter-digitated comb drives to produce the required displacements of the microshutter. Besides the difficulties with generating such voltages at the operating frequencies of micromachined devices, such large actuation voltages, as well as the fields associated with the electromagnetic drives, pose difficulties in taking measurements as not only they appear as interference at the output but they also modify the electric field distribution in the vicinity of the sensor electrode, thereby negatively impacting sensor sensitivity as well as accuracy.

Another type of MEFS is a fiber optic electric field sensors which have been developed and used for high voltage applications. In brief, such fiber optic electric field sensors utilizes dipole antenna to converts an electric field into voltage which is then either applied to electrodes on a waveguide device based on electro-optic crystals to induce polarization rotation of light passing through it (as exemplified in U.S. Pat. No. 6,388,834) or to a diffractive device to alter its optical attenuation and thereby the amount of light passing through it (as exemplified in U.S. Pat. Application Publication No. US2013/0271113); the strength of the electric field is therefore measure based on the amount of light polarization or the amount of light transmittal.

However, these sensors are affected by many factors such as strain and temperature and do not provide the required high accuracy and reliability (especially in lower voltage settings).

More recently, yet another type of MEFS uses capacitive interrogation of an electrostatic force deflected microstructure, with a laser deflection measurement system for monitoring of extent of microstructure deflection (as exemplified in "MEM Electric Field Sensor using Force Deflection with Capacitance Interrogation", Chen, T. and Shafai, C., Power and Energy Society General Meeting (PES), 2013 IEEE, pp. 21-25, 2013). Such a sensor was demonstrated to be effective for high strength electric field measurements (up to 16 kV/m) as well as for low strength field measurements (down to 400 V/m), but however, such type of sensor requires to be grounded and thereby restricting its industrial application.

SUMMARY OF THE INVENTION

In view of the foregoing disadvantages of the prior art, the present invention relates to a new and improved design of MEFS-type electric field/potential sensor with adjustable sensitivity for both low and high strength electric field measurements as well as the ability to operate without reference ground connection.

According to one aspect of the present invention, there is provided an MEFS-type sensor device for measuring electrical voltage or potential of a source, the device comprising a first electrode and a second electrode that are rigidly connected together via a joining segment so that the first electrode and second electrode are mutually and dependently pivotal about an axis passing through a joining segment to form a tiltable unit, wherein the first electrode and second electrode are electrically isolated from each other, and each of the first electrode and second electrode is charged with an electric charge that is opposite to each other.

In the absence of an electric field, the tilting unit would be in a first resting position. When the device is subjected to a direct current (DC) electric field, the two differentially charged first electrode and second electrode would be subject to different forces of attraction with respect to the electric field source (the negatively charged electrode side of the tiltable unit would be pulled more towards the electric field source and the positively charged electrode side of the tiltable unit to a lesser extent), thereby resulting in a rotational motion of the tiltable unit to a second tilted position. The extent of rotational motion can be detected and measure by conventional means such as a light (e.g. laser) position measurement system wherein a light (e.g. laser) beam is directed onto a reflective surface positioned on the tilting unit such as the joining segment and measurement is taken on changes in the positioning of the reflected light beam and/or the angles of incidence/reflection of the light (e.g. laser) beam resulting from a rotational motion of the tiltable unit.

In one embodiment, if each of the first electrode and second electrode is charged by a DC (direct current) voltage source that is opposite in charge to each other, the angular change over which the tiltable unit tilts under a DC electric field would be in relation to the differential strength and effect of the electric field upon each of the two electrodes with respect to the source of the electric field, and it would also depend on the level of charge imparted on each of the electrodes. For instance, the higher the charge resident on each electrode would make the tiltable unit more sensitive to the influence of the electric field, thereby rendering the more useful for measurement of low strength (sub-1 V/m) electric fields, and vice versa for measuring high strength (MV/m) electric fields. That being said, a continuous DC electric field would continuously saturate the electrodes and rest of the device with electrons and the baseline and calibration would shift over time if this increasingly accumulated negative charge is not periodically discharged through grounding.

Conversely, in the illustrated and preferred embodiment, each of the two electrodes is charged by oppositely phased AC (alternating current) voltage sources (i.e. the two voltage sources are 180 degree out of phase with each other). The AC frequency may be between 500 Hz and 2 kHz, but preferably be set to coincide with the natural frequency of vibration (or resonance frequency) of the tiltable unit. Under such a setup, as the charge on each of the electrode alternates between positive and negative (out of phase with each other) at the AC frequency, the rotational motion of tiltable unit induced by the DC electric field would correspondingly reciprocate/oscillate at the AC frequency. As such, the magnitude of the reciprocations/oscillations would be in relation to the strength of the electric field at the location of the device with respect to the source of the electric field, and it would again depend on the level of charge imparted on each of the electrodes (higher the charge, the more sensitive the sensor for measurement of low strength electric fields, and vice versa). However, since each of the electrodes is charged alternately and reciprocally to be positive and negative at the set AC frequency, the continuous deposition of electrons from the DC electric field would not have significant chance to accumulate on the electrodes, hence this setup has the ability to operate without reference ground connection.

For signal processing, it should be readily apparent to a skilled person in the art that there may be provided signal processor means (such as amplification, filtering, etc.) arranged to determine an electric field of the source to be measured using the deflections measured by the sensor device.

Alternatively, when the device is subjected to an alternating current (AC) electric field, the two differentially charged first electrode and second electrode would again be subject to different forces of attraction with respect to the electric field source, again thereby resulting in a rotational motion of the tiltable unit to a second tilted position. As the AC electric field reverses direction over each 180 degree-cycles, the rotational motion of tiltable unit induced by the AC electric field would correspondingly reciprocate/oscillate at the frequency of the AC electric field, and there would be no need for the two electrodes to be charged by oppositely phased AC (alternating current) voltage sources. That being said, it should be readily apparent to a skilled person in the art that despite the non-necessity, the two electrodes can still be charged by oppositely phased AC (alternating current) voltage sources, and in such a circumstance, it would be preferable if the frequency of such AC (alternating current) voltage sources to be synchronized with the frequency of the AC electric field.

As per the above, the extent of rotational motion of the tilting unit can again be detected and measure by conventional means such as a light (e.g. laser) position measurement system, and the magnitude of the reciprocations/oscillations would again be in relation to the strength of the electric field at the location of the device with respect to the source of the electric field, and it would again depend on the level of charge imparted on each of the electrodes (higher the charge, the more sensitive the sensor for measurement of low strength electric fields, and vice versa).

In another aspect, the MEFS-type sensor device of the present invention can also be configured and used to measure magnetic field strength, which device involving rendering the first electrode and second electrode to be connected in series, for example using conventional (re-)switching means and connections generally known to those of ordinary skill in the art, so to enable a current flow through the first electrode and second electrode in opposite directions. Under such a setup, the direction of the magnetic field to be measured would be substantially perpendicular to the rotational axis of the tilting unit and substantially along the same plain wherein the first electrode and second electrode would lie, and which magnetic would induce opposite movement of the first electrode and second electrode owing to the opposite current flowing through the first electrode vs. the second electrode. It should be readily apparent to a skilled person in the art that the use of the first electrode and second electrode as conduit for current flow herein is simply for convenience as they are already in place for the measurement of electric field, and that equivalent setups are possible so long that the magnetic field to be measured can induce a tilting of the tilting unit because two opposing current flows at either end of the tilting unit.

According to another aspect of the present invention, there is provided a method of application and use of the MEFS of the present invention. In general, the applicability and utility of a MEFS that does not need reference ground connection and that can work for accuracy for low strength and high strength electric fields are readily apparent in view of the diverse applications that require sensitive and/or spatial measurement of electric field or potential.

In one embodiment, the inventors contemplate the use of the MEFS of the present invention in controlling the charge on photoreceptors in xerographic type copiers/printers for electrostatic image control purposes. Details of the xerographic device and method of operation are generally known to those of ordinary skill in the art.

In another embodiment, the inventors also contemplate the use of the MEFS of the present invention in the electrical/gas utility setting for applications ranging from the monitoring and measurement of electric fields emitted by power conductors and electrical apparatuses, to the monitoring and measurement of cathodic protection potentials on natural gas pipeline systems. For example, the MEFS of the present invention can be used to measure the cathodic potential between gas line and ground so for continuous monitoring of metallic gas pipe corrosion and rate thereof.

In a further embodiment, the MEFS of the present invention is also useful for detection of static charge build up, which has application in monitoring of atmospheric electrical fields and charges (for instance in detection of lightning storms and other weather systems), and in detecting static in air for diverse purposes ranging from safe storage of explosives, mining, air filtration systems, and other applications where sensitive electronics are manufactured.

Other features and advantages of the present invention will become apparent from the following detailed description. It should be understood, however, that the detailed description and the specific examples while indicating preferred embodiments of the invention are given by way of illustration only, since various changes and modifications within the spirit and scope of the invention will become apparent to those skilled in the art from this detailed description.

BRIEF DESCRIPTION OF THE DRAWINGS

For a more detailed disclosure of the invention and for further objects and advantages thereof, reference is to be had to the following description taken in conjunction with the accompanying drawings, in which:

FIG. 2b is a top plan view of the sensor device for measuring magnetic field strength comprising two electrodes 10a and 10b of the tiltable unit, with each electrode being physically and electrically connected to a torsional spring providing pivot point for rotation of the tiltable unit and wherein the torsional springs 40a and 40b are re-arranged (with the aid of added electrical connectors 40c and 40d) so to connect the two electrodes 10a and 10b to be electrically in series.

FIG. 2d is a top plan view of another variant embodiment of the sensor device for measuring magnetic field strength comprising an added electrode 40e that substantially perimeters the tiltable unit and that is physically rigidly connected with the two electrodes 10a and 10b, but electrically isolated from the two electrodes 10a (and 40a) and 10b (and 40b), and that electrode 40e is connected to a current source to effect current flow.

FIG. 5 is a graphical illustration of the linear responses of the sensor device of the present invention to DC electric fields from 0-120 kV/m, and for different ac bias voltages at sensor resonance of 597 Hz. Graph (a) shows the responses to measurement of incident DC electric fields over >1 kV/m, taken for two AC bias voltages; and graph (b) shows the responses to measurements of DC electric fields below <1 kV/m.

In the drawings like characters of reference indicate corresponding parts in the different figures.

DETAILED DESCRIPTION

The present invention provides a torsional rotating MEFS sensor device that employs differential biased electrodes on the rotating membrane. This novel design enables superior sensitivity with significantly reduced bias voltage compared to prior art devices, and operation without reference ground.

In a first aspect of the present invention, there is provided an MEFS-type sensor device for measuring electrical voltage or potential of an AC or DC voltage source, the device comprising a first electrode and a second electrode that are rigidly connected together via a joining segment so that the first electrode and second electrode are mutually and dependently pivotal about an axis passing through a joining segment to form a tiltable unit, wherein the first electrode and second electrode are electrically isolated from each other, and each of the first electrode and second electrode is charged with an electric charge that is opposite to each other. For the purpose herein, each electrode may be a single "pane" of an electrically conductive (or less preferably semi-conductive) material, or it may consist of a multiple or array of electrodes each being smaller "pane" of such material.

Figure 1:
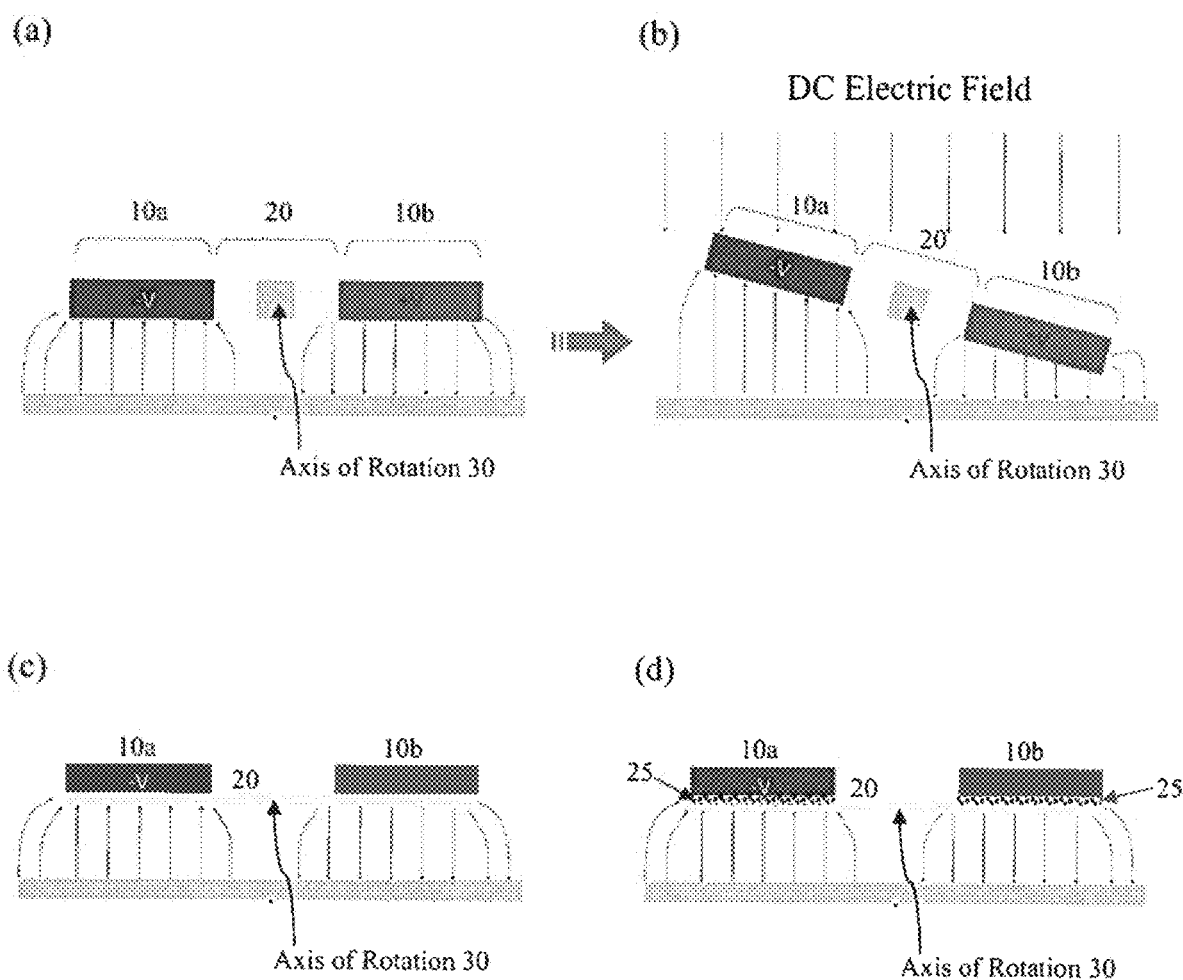
FIG. 1 is a simple diagrammatic illustration of the basic operating principles of the tiltable unit comprising the two electrodes 10a and 10b and the joining segment 20: (a) in a first resting position in absence of electric field; and (b) in a rotated second position when subject to a DC electric field.

Referring to the accompanying drawings, FIG. 1(a) is a simple diagrammatic illustration of the basic operating principles of the tiltable unit illustrating a first electrode 10a and a second electrode 10b rigidly connected together via a joining segment 20. In one embodiment, electrodes 10a and 10b are made of an electrically conductive material (e.g. a metal such as copper or gold), and less preferably a semi-conductive material, where the joining segment 20 is made of an electrically non-conductive material (e.g. plastics, silicon dioxide).

In an alternative embodiment, FIG. 1(c) is another diagrammatic illustration of an alternative configuration as to how the first electrode 10a and the second electrode 10b may be arranged in relation and onto a joining segment 20.

The importance here is that the first electrode 10a and the second electrode 10b are electrically isolated from each other, and it should be readily apparent to a skilled person in the art that if, for instance as illustrated in FIG. 1(d), joining segment 20 is not made of an insulative material, an insulative material 25 may be placed between an electrode and the joining segment so to maximize or achieve electrical isolation.

FIG. 1(a) illustrates the tiltable unit of the sensor device in a first resting position in absence of electric field; and FIG. 1(b) illustrates the tiltable unit of the sensor device in a rotated second position about pivot 30 when the electrodes 10a and 10b are oppositely charged and when the tiltable unit is subject to a DC electric field. The negatively charged electrode 10a would be tilted towards the electric field source and the positively charged electrode 10b would be tilted away from the electric field source, whereas the amount of movement and angular tilt would be proportional to the strength of the electric field at the location of the device in relation to the source of the electric field, and it would also depend on the level of charge imparted on each of the electrodes.

Figure 2A:
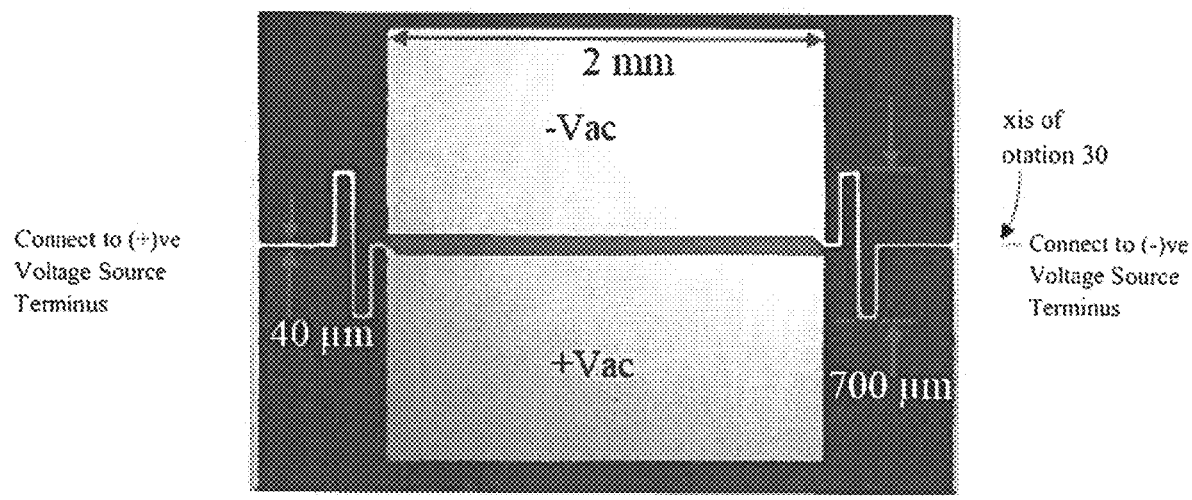
FIG. 2a is a top plan view of the sensor device for measuring electric field strength comprising two electrodes 10a and 10b of the tiltable unit, with each electrode being physically and electrically connected to a torsional spring (40a or 40b) providing opposite electrical charge to the two electrodes and pivot point for rotation of the tiltable unit.

Referring to FIG. 2a, there is illustrated a top plan view of the sensor device comprising first electrode 10a and second electrode 10b of the tiltable unit wherein the first electrode 10a is physically and electrically connected to a first torsional spring 40a, and the second electrode 10b is physically and electrically connected to a second torsional spring 40b. When the electrodes 10a and 10b are physically connected (but electrically separated) by joining segment 20, the first and second torsional springs 40a and 40b act as a fulcrum for the electrodes 10a and 10b to become mutually and dependently pivotal about an axis of rotation 30. In this exemplified embodiment, the first and second torsional springs 40a and 40b each have a thickness of 40 um and are made of a conductive material such as copper. For this example, the electrode and torsional springs can be fabricated from single crystal silicon using a bulk micromachining process and thinning same structures to 14 μm thick. It should be readily apparent to a skilled person in the art that the design and use of torsional springs 40a and 40b for charging electrodes 10a and 10b simultaneously whilst serving as the fulcrum in this present embodiment is simply for efficiency purpose, and an alternative setup may be to use different connectors for charging vs. for pivoting. The first electrode 10a is negatively charged (−V) as the first torsional spring 40a is connected to a (−)ve voltage source, whereas the second electrode 10b is positively charged (+V) as the second torsional spring 40b is connected to a (+)ve voltage source. As aforementioned, this setup is for measuring electric field strength.

Referring to FIG. 2b, the MEFS-type sensor device of the present invention can also be configured and used to measure magnetic field strength. For measurement of magnetic field strength, the first electrode 10a and second electrode 10b are not required to be differentially charged, but rather, the circuit is re-arranged so that the two electrodes 10a and 10b are connected electrically in series and thereby allowing current flow in directions substantially perpendicular to the direction of the magnetic field.

In a preferred embodiment, the differentially charging circuit is disconnected from torsional springs 40a and 40b, and instead: (a) a first electrical connector 40c is added to electrically contact the first electrode 10a so that the first electrode 10a can be electrically connected to a first (−ve) terminus of a current source; (b) a second electrical connector 40d is added to electrically connect the first torsional spring 40a with the second electrode 10b; and (c) the original second torsional spring 40b is electrically connected to a second (+ve) terminus of a current source. Under such a setup, current would flow from first (−ve) terminus of a current source to first electrical connector 40c, to first electrode 10a, to first torsional spring 40a, to second electrical connector 40d, to second electrode 10b, to second torsional spring 40b, and then to the second (+ve) terminus of a current source.

In this example illustrated in FIG. 2b, when this setup is subject to a magnetic field where the direction of the magnetic field is from top to bottom of the figure, the current flow along the first electrode 10a from the left to right would induce a movement of first electrode 10a (via Lorentz force) towards the reader, whereas the current flow along the second electrode 10b from the right to left would induce a movement of second electrode 10b (via Lorentz force) away from the reader. These opposite movements would then translate into a tilting of the tiltable unit. In other words, the direction of the magnetic field to be measured by this setup would be substantially perpendicular to the rotational axis of the tilting unit and substantially along the same plain wherein the first electrode and second electrode would lie.

By analogy to the aforementioned setup for measurement of electric field, if the current source to the first and second electrodes 10a and 10b (and hence current flow therethrough) for this instance is an alternating current (AC), then the tiltable unit would reciprocate/oscillate at the frequency of the AC current. The magnitude of the reciprocations/oscillations would be in relation to the strength of the magnetic field at the location of the device with respect to the source of the magnetic field, and it would again depend on the level of current applied through each of the electrodes (higher the current, the more sensitive the sensor for measurement of low strength magnetic fields, and vice versa).

Figure 2C:
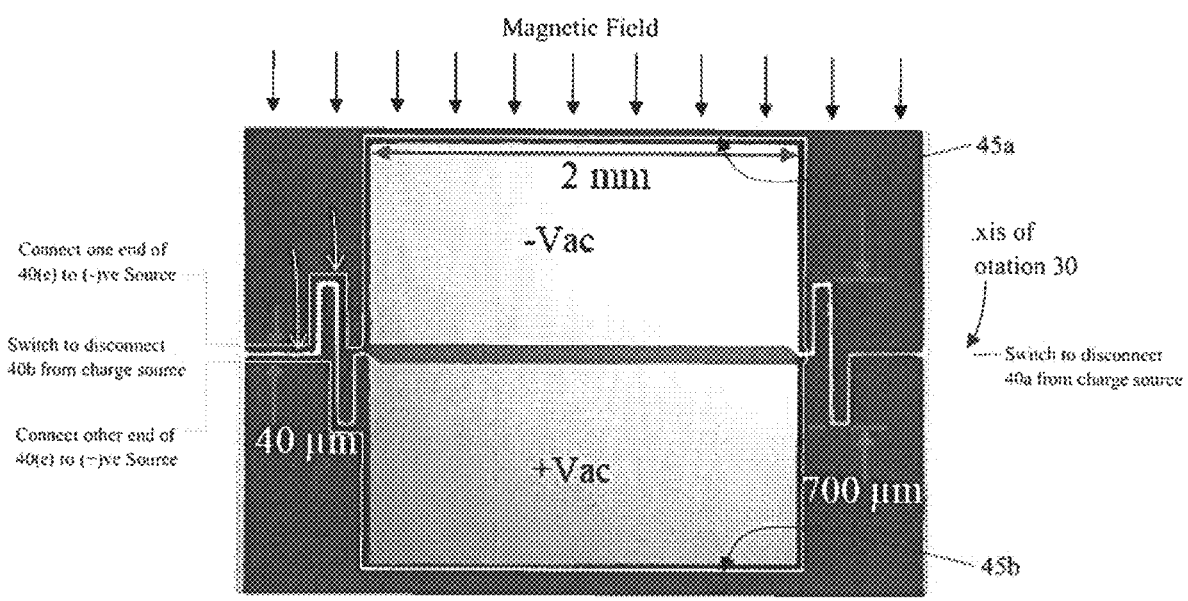
FIG. 2c is a top plan view of a variant embodiment of the sensor device for measuring magnetic field strength comprising an added electrode 40e that substantially perimeters the tiltable unit and that is physically rigidly connected with the two electrodes 10a and 10b, but electrically isolated from the two electrodes 10a and 10b, and that electrode 40e is connected to a current source to effect current flow.

It should be readily apparent to a skilled person in the art that the use of the first electrode and second electrode as conduit for current flow herein is simply for convenience as they are already in place for the measurement of electric field, and that equivalent setups are possible so long that the magnetic field to be measured can induce a tilting of the tilting unit because two opposing current flows at either end of the tilting unit. A variant embodiment of this setup is illustrated in FIG. 2c, wherein instead of having the existing first electrode 10a and second 10b to serve as current conduits, an added electrode 40e that substantially perimeters the tiltable unit and that is physically and rigidly connected with the two electrodes 10a and 10b can serve as the conduit for current flow. In this embodiment, the two ends of the added connector 40e would be connected respectively to the (−)ve terminus and the (+) terminus of a current source, and obviously in such an event, the first and second torsional springs 40a and 40b would be disconnected from the voltage source of charge.

When the added connector 40e is connected to a current source and subject to a magnetic field as per above as illustrated in FIG. 4c, the horizontal segment of the added connector 40e that is immediately adjacent to the first electrode 10a (labelled 45a in FIG. 2c) would be moved (via Lorentz force) towards the reader, whilst the horizontal segment of the added connector 40e that is immediately adjacent to the second electrode 10b (labelled 45b in FIG. 2c) would be moved (via Lorentz force) away from the reader. If the current source to this added connector 40e (and hence current flow there-through) is an alternating current (AC), then the tiltable unit would again reciprocate/oscillate at the frequency of the AC current. The magnitude of the reciprocations/oscillations would again be in relation to the strength of the magnetic field at the location of the device with respect to the source of the magnetic field, and it would depend on the distance of the horizontal segments 45a and 45b from the axis of rotation 30, as well as the level of current applied through each of the electrodes (higher the current, the more sensitive the sensor for measurement of low strength magnetic fields, and vice versa).

A variant embodiment of the sensor device for measuring magnetic field strength is set forth in FIG. 2d wherein the device still comprises an added electrode 40e that substantially perimeters the tiltable unit and that is physically rigidly connected with the two electrodes 10a and 10b, but is electrically isolated from the two electrodes 10a (and 40a) and 10b (and 40b), and that electrode 40e is connected to a current source to effect current flow. This diagram is simply a clearer representation of the connectors for the electrodes 10a and 10b for measuring electric field strength and connectors for the added electrode 40e for measuring magnetic field strength.

Figure 3:
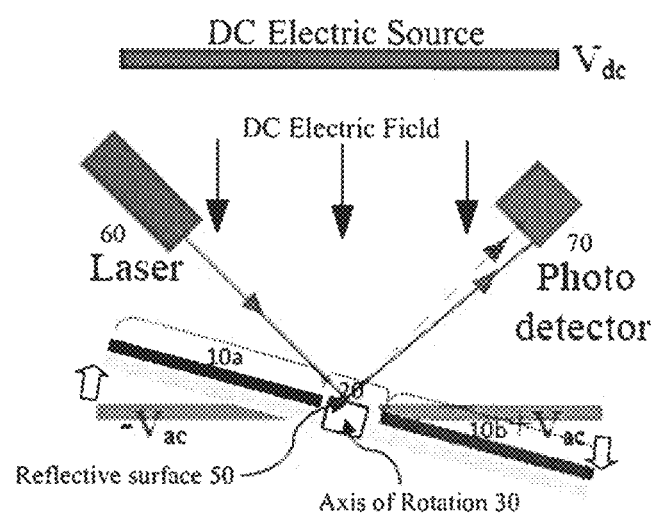
FIG. 3 is a diagrammatic illustration of the working principle of the sensor including an example placement of a reflective surface on the tiltable unit and a light (laser) position measurement system.

FIG. 3 illustrates the basic working principle of the tiltable unit in combination with a light (laser) position measurement system. The principle purpose and mechanism of action of the tiltable unit is described above, and the extent of angular rotation of the tiltable unit caused by an electric field or a magnetic field is monitored and measured by positioning of a reflective surface 50 on the tiltable unit to act as a point of incidence for reflection of an incident laser beam emitted by a laser source 60 and monitoring of the positioning of the reflected laser beam using a laser detector 70. As exemplified in this figure, when the tiltable unit is rotated from a first resting position to a second position under the influence of an electric field, the angle of incidence and the angle of reflection increase and the reflected laser beam would strike the detector 70 at a different position.

In this embodiment, the reflective surface 50 is positioned on the joining segment 20 to prevent any potential interference, and it may be simply be an area of joining segment 20 that is polished to become sufficiently reflective, or it may be achieved by placement a mirror-like layer of reflective material onto same area of the joining segment 20 (such as a metallic film) provided that the electrical isolation between first electrode 10a and second electrode 10b is not disrupted. In any case, it should be readily apparent to a skilled person in the art that a sufficiently reflective area on either electrode may also serve as reflective surface 50.

Figure 4:
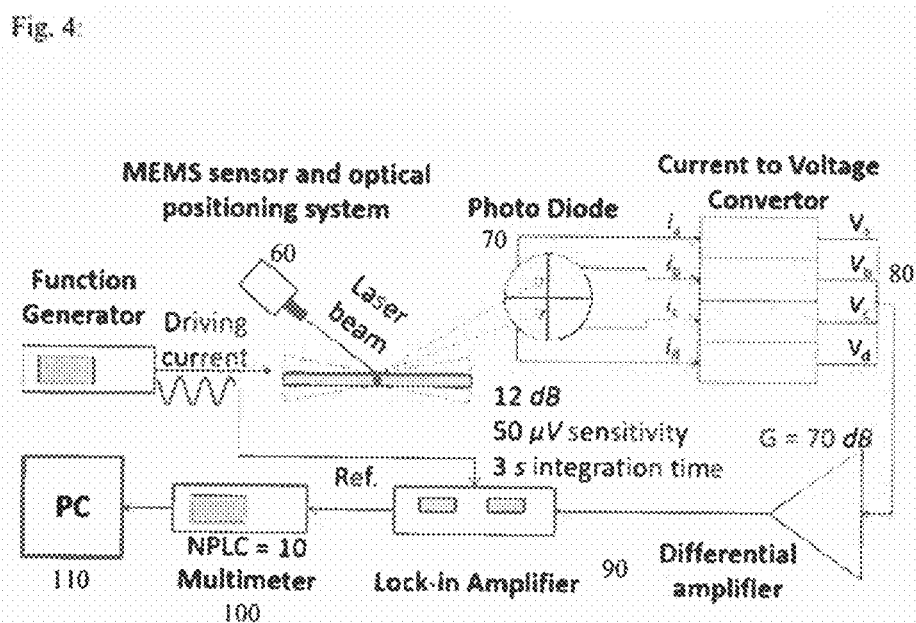
FIG. 4 is a diagrammatic illustration of an example of the signal processing setup for the sensor device of the present invention.

Referring to FIG. 4, in measurement of a DC electric field, if the charge being applied to the first electrode 10a and the second electrode 10b are from two sinusoidal AC voltage sources that are 180 degree out-of-phase against each other, for the first 180 degrees of a cycle, one electrode would bear one charge and the other electrode would bear the opposite charge (e.g. electrode 10a would be negative and electrode 10b positive), and for the second 180 degrees of the cycle, the charge on each electrode would switch (i.e. electrode 10a would now be positive and electrode 10b negative). Under a DC electric field, as aforementioned, the negatively charged electrode would tilt toward the source of the field whereas the positively charged electrode would tilt away the source of the field; and accordingly, electrode 10a would tilt up for the first 180 degrees of a cycle and tilt down for the second 180 degrees of the cycle (and vice versa for electrode 10b). The resulting effect is that the tiltable unit would "seesaw" up and down for each AC cycle, and the amplitude would be proportionate to the strength of the electric field, and in this preferred embodiment, the amplitude can also be adjusted (controlled) by adjusting the amount of charge being applied to the two electrodes. In other words, since a low strength electric field would only produce small rotational movements, a user can simply increase the rotational movements (i.e. sensitivity) by increasing the charge being applied to the electrodes (and vice versa). As such, the sensor device of the present invention can be tuned to be useful for measuring both low and high electric fields.

Preferably, the first electrode 10a is charged by a first alternating current voltage source alternating at a first frequency and the second electrode 10b is charged by a second alternating current voltage source alternating at a second frequency, wherein the first frequency is the same as the second frequency but is 180 degree out-of-phase against the second frequency. Yet further, as the tiltable unit has a natural frequency of vibration, sensitivity of this setup can be improved if the first frequency and the second frequency are set to approximate such a natural frequency of vibration (i.e. resonance frequency) of the tiltable unit. Under such a setup, with the current embodiment, the noise limited resolution of approximately 3 V/m can be achieved, notwithstanding the allowance for lower charging voltages to be used thereby reducing the power consumption needs of the sensor device.

As aforementioned, in measurement of an AC electric field, the charge (driving current in the figure) being applied to the first electrode 10a and the second electrode 10b is a DC voltage source, and each electrode would be constantly charged with the same charge that is opposite to each other. In such a case, the reciprocation/oscillation motion of the tilting unit would be a result of the AC electric field as opposed to the driving current. As such, one must be cognizant that if the frequency of the AC field does not coincide with the resonance frequency of the tiltable unit, same can impact the efficiency and sensitivity of the sensor.

Analogously, in measurement of a magnetic field, if the current applied to the first electrode 10a and the second electrode 10b is an alternating current (AC), then for the first 180 degrees of a cycle, one electrode would have current flowing in one direction and the other electrode would have current flowing in the opposite direction, and the tiltable unit would tilt in one direction, and for the second 180 degrees of the cycle, the current flow through each electrode would switch/reverse and the tiltable unit would tilt to the other direction. The resulting effect is again that the tiltable unit would "seesaw" up and down for each AC cycle, and the amplitude would be proportionate to the strength of the magnetic field, and in this preferred embodiment, the amplitude can also be adjusted (controlled) by adjusting the amount of current being applied through the two electrodes. In other words, since a low strength magnetic field would only produce small rotational movements, a user can simply increase the rotational movements (i.e. sensitivity) by increasing the current being applied through the electrodes (and vice versa). As such, the sensor device of the present invention can also be tuned to be useful for measuring both low and high magnetic fields.

Yet further, to further reduce power consumption required, the tiltable unit of the sensor device may be put inside a vacuum chamber so to reduce air dampening on the oscillations of the tiltable unit thereby enabling it to reciprocate more freely based on its natural resonance. However, it is important to note that if the sensor electrode circuit is encased in a vacuum, consideration must be given to accommodate passage of the electric field/potential to the electrodes, and that interpretative compensation may be required to account for any delay or reduction of such passage of the electric field/potential to the electrodes.

Once a change in position where the reflective laser beam strikes the laser detector 70, FIG. 4 also illustrates an example of the downstream signal processing needs for the present invention in terms of conversion of photonic energy to electric current by the photo diode in laser detector 70, current-to-voltage conversion 80, differential and lock-in amplification 90, measurement of resulting signal by multimeter 100, and electronic recordal and computer management of the data 110 (e.g. calibration and calculation of electric field strengths).

In terms of the performance of the sensor device of the present invention, FIG. 5 presents empirical data to evidence its sensitivity and utility for both high strength electric field measurements as well as low strength electric field measurements. Referencing FIG. 5(a), the AC voltage applied to the electrodes ranged between 0.3-0.5 sin(wt) and the output is observably linear between approximately 10 kV/m to approximately 120 kV/m (high strength electric fields). Comparatively, referencing FIG. 5(b), the AC voltage applied to the electrodes was set higher at 5.7 sin(wt) and the output is observably linear between 0 to approximately 1 kV/m (low strength electric fields). The frequency of the AC voltage applied to the electrodes was 597 Hz to coincide with the resonance frequency of this particular tiltable unit.

Based on the operating principles of the sensor device of the present invention, it should also be readily apparent to a skilled person in the art that the sensitivity of the MEFS as presented in the aforementioned embodiments can be modified and tailored to different applications involving different field strengths. Notwithstanding its lower field sensitivity as described above, the MEFS of the present invention can also be used to sense electric fields of thousands to millions of V/m, and any electronic nonlinearities that may be encountered at higher field strengths may be overcome by using automatic gain control blocks to keep the amplifiers in their linear region.

As described herein, the present invention relates to a field sensor device which may be operable (i) only in an electric field sensing mode, (ii) only in a magnetic field sensing mode, or (iii) in a selected one of either the electric field sensing mode or the magnetic field sensing mode depending upon the particular embodiment described above.

In each instance, the device typically includes a base frame such as a housing or other comparable supporting structure capable of supporting the various components of the device thereon as represented by the perimeter boundary in FIGS. 2a through 2c for example. A pivot frame is then supported on the base frame for pivotal movement due to rotational forces which urge rotation of the pivot frame relative to the base frame in response to an electric field or a magnetic field depending upon the mode of operation. The pivot frame generally comprises the joining segment, and the electrodes supported thereon collectively forming a tiltable unit as described above.

A typical embodiment will include a first conductor and a second conductor supported on the pivot frame in the form of a first electrode 10a and a second electrode 10b respectively as described above. The conductors are supported at diametrically opposing sides of the pivot axis of the pivot frame so as to lie in a generally common plane with the pivot axis.

An electrical controller which defines the charge sources for use in the electric field sensing mode and which defines the current source in the magnetic field sensing mode is typically also supported on the base frame in proximity to the pivot frame. The electrical controller is operable in an electric field sensing mode in which the first conductor and the second conductor are charged by the electrical controller with respective electrical charges which are opposed to one another such that the electrical charges induce rotational forces to urge rotation of the pivot frame relative to the base frame about the pivot axis away from the neutral position in a common direction of rotation in response to the electric field. The electrical controller is also operable in a magnetic field sensing mode in which the first conductor and the second conductor receive an electrical current from the electrical controller passing therethrough in opposite directions relative to one another such that the electrical current induces rotational forces to urge rotation of the pivot frame relative to the base from about the pivot axis away from the neutral position in a common direction of rotation in response to the magnetic field.

In some instances, switches are used to be operable between an open state in which the first and second conductors are electrically isolated from one another so as to be adapted to carry charges thereon in the electric field sensing mode and a closed state in which the first and second conductors are electrically connected in series with one another so as to be adapted to receive an electrical current therethrough in the magnetic field sensing mode.

A third conductor may be provided about the perimeter of the pivot frame, which is described above as a third electrode. The third conductor includes a first portion extending alongside the first conductor and a second portion extending alongside the second conductor so that the first and second portions of the third conductor are diametrically opposed from one another relative to the pivot axis while lying in a generally common plane with the pivot axis. The first and second portions of the third conductor form a continuous loop such that a current passing through the third conductor results in a current flow direction within the first and second portions which are in opposite directions relative to one another.

When provided with first, second and third conductors as described above, the device may use the first and second conductors in the electrical field sensing mode when electrically isolated from one another while relying only upon the third conductor to receive a current therethrough in the magnetic field sensing mode.

Alternatively, when using switches as described above, the first and second conductors can be used for either electrical field sensing or magnetic field sensing depending upon the condition of the switches and the mode of the controller.

In further arrangements, the third conductor may be omitted and the first and second conductors may remain electrically isolated from one another such that the device is only operable in the electrical field sensing mode.

In yet a further arrangement, the third conductor may again be omitted, but the first and second conductors may remain electrically connected in series with one another such that the device is only operable in the magnetic field sensing mode.

In either mode, the pivot frame is typically supported on the base frame by torsional springs at axially opposing ends of the pivot axis in which the springs provide the dual function of (i) an electrical connection between the conductors and the electrical controller, and (ii) biasing means to bias the frame to a neutral position. When the device is exposed to a field, the resulting forces of an electric field acting on charged conductors in the field sensing mode or of a magnetic field acting on a current passing through the conductors in the magnetic field sensing mode produce rotational forces acting on the pivot frame to displace the pivot frame away from the neutral position in either one of two opposing directions of rotation towards either one of two opposing deflected positions. When using an alternating current source, the pivot frame will oscillate between the two opposed deflected positions. Adjustment of the strength of the biasing force can be used to control the sensitivity of the field sensing in either mode.

Alternatively, the biasing force provided by the springs can also be reduced to a negligible amount relative to the resistive forces of a dampening mechanism. In this instance, controlling the strength of the resistive forces of the dampening mechanism can be used to control the sensitivity of the field sensing in either mode.

All publications, patents and patent applications referred to herein are incorporated by reference in their entirety to the same extent as if each individual publication, patent or patent application was specifically and individually indicated to be incorporated by reference in its entirety.

Having illustrated and described the principles of the invention in a preferred embodiment, it should be appreciated to those skilled in the art that the invention can be modified and/or varied in arrangement and detail without departure from such principles. Accordingly, it is intended to embrace all such modifications and/or variations that fall within the spirit and broad scope of the appended claims.

The invention claimed is:

1. A field sensor device for sensing at least one of an electric field or a magnetic field, the device comprising:
   a base frame;
   a pivot frame supported on the base frame so as to be pivotal relative to the base frame about a pivot axis of the pivot frame between a neutral position and at least one deflected position;
   a first conductor and a second conductor supported on the pivot frame at diametrically opposing locations relative to the pivot axis of the pivot frame; and
   an electrical controller operatively connected to the first conductor and the second conductor and being operable in an electric field sensing mode in which the first conductor and the second conductor are electrically isolated from each other and are charged by the electrical controller with respective electrical charges which are opposed to one another such that the electrical charges induce rotational forces to urge rotation of the pivot frame relative to the base frame about the pivot axis away from the neutral position in a common direction of rotation in response to the electric field;
   wherein the electrical controller is adapted to charge the first conductor by a first alternating current voltage source alternating at a first frequency and to charge the second conductor by a second alternating current voltage source alternating at a second frequency; the first frequency is the same as the second frequency but is 180 degree out-of-phase against the second frequency; whereby the electrical charges on the first and second conductors induce rotational forces to urge rotation of the pivot frame relative to the base frame about the pivot axis away from the neutral position that reverse every 180 degrees thereby resulting in oscillatory rotation of the pivot frame.

2. The device according to claim 1 wherein the first conductor and second conductor supported on the pivot frame form a pivot unit which has a natural frequency of vibration relative to the base frame and the first frequency and the second frequency are set to approximate said natural frequency of vibration of the pivot unit.

3. The device according to claim 1 wherein a magnitude of a displacement of the pivot frame from the neutral position towards said at least one deflected position is proportional to a strength of the electric field.

4. The device according to claim 3 further comprising a displacement sensor adapted to measure the magnitude of displacement of the pivot frame from the neutral position towards said at least one deflected position and processor arranged to determine the strength of the electric field based upon the magnitude of displacement of the pivot frame as measured by the sensor.

5. The device according to claim 1 wherein the first conductor and the second conductor each comprise a flat sheet of material and wherein the flat sheets of material lie in a generally common plane with the pivot axis.

6. The device according to claim 1 further comprising a biasing arrangement which is arranged to bias the pivot frame towards the neutral position, wherein the rotational forces induced upon the pivot frame act against the biasing arrangement.

7. The device according to claim 6 wherein the biasing arrangement comprises a pair of torsional springs which are connected between the pivot frame and the base frame at axially opposing ends of the pivot frame.

8. The device according to claim 7 wherein the first and second conductors are electrically connected to the electrical controller by the springs.

9. A field sensor device for sensing at least one of an electric field or a magnetic field, the device comprising:
   a base frame;
   a pivot frame supported on the base frame so as to be pivotal relative to the base frame about a pivot axis of the pivot frame between a neutral position and at least one deflected position;
   a first conductor and a second conductor supported on the pivot frame at diametrically opposing locations relative to the pivot axis of the pivot frame;
   an electrical controller operatively connected to the first conductor and the second conductor and being operable in an electric field sensing mode in which the first conductor and the second conductor are electrically isolated from each other and are charged by the electrical controller with respective electrical charges which are opposed to one another such that the electrical charges induce rotational forces to urge rotation of the pivot frame relative to the base frame about the pivot axis away from the neutral position in a common direction of rotation in response to the electric field; and
   an auxiliary conductor supported on the pivot frame so as to be electrically isolated from the first conductor and the second conductor;
   the auxiliary conductor including a first conductive portion and a second conductive portion which are connected in series with one another and which are supported on the pivot frame at respective diametrically opposing locations relative to the pivot axis of the pivot frame;
   the auxiliary conductor being connected to the electrical controller such that the first conductor and the second conductor receive an electrical current from the electrical controller passing therethrough in opposite directions relative to one another such that the electrical current induces rotational forces to urge rotation of the pivot frame relative to the base from about the pivot axis away from the neutral position in a common direction of rotation in response to the magnetic field.

10. The device according to claim 9 wherein the electrical controller is adapted to apply the auxiliary current to the auxiliary conductor as an alternating current whereby the alternating current passing through the first and second conductors induces rotational forces to urge rotation of the pivot frame relative to the base frame about the pivot axis away from the neutral position that reverse every 180 degrees thereby resulting in oscillatory rotation of the pivot frame.

11. The device according to claim 10 wherein the first conductor, second conductor, and auxiliary conductor supported on the pivot frame form a pivot unit which has a natural frequency of vibration relative to the base frame and a frequency of the alternating current approximates said natural frequency of vibration of the pivot unit.

12. A field sensor device for sensing at least one of an electric field or a magnetic field, the device comprising:
   a base frame;
   a pivot frame supported on the base frame so as to be pivotal relative to the base frame about a pivot axis of the pivot frame between a neutral position and at least one deflected position;
   a first conductor and a second conductor supported on the pivot frame at diametrically opposing locations relative to the pivot axis of the pivot frame; and
   an electrical controller operatively connected to the first conductor and the second conductor and being operable in a magnetic field sensing mode in which the first conductor and the second conductor are in electrical communication with each other and receive an electrical current from the electrical controller passing therethrough in opposite directions relative to one another such that the electrical current induces rotational forces to urge rotation of the pivot frame relative to the base from about the pivot axis away from the neutral position in a common direction of rotation in response to the magnetic field;
   wherein the first and second conductors are connected in series with one another and wherein the electrical controller is adapted to apply the electrical current to the first and second conductors as an alternating current whereby the alternating current passing through the first and second conductors induces rotational forces to urge rotation of the pivot frame relative to the base frame about the pivot axis away from the neutral position that reverse every 180 degrees thereby resulting in oscillatory rotation of the pivot frame;
   wherein the first conductor and second conductor supported on the pivot frame form a pivot unit which has a natural frequency of vibration relative to the base frame; and
   wherein a frequency of the alternating current approximates said natural frequency of vibration of the pivot frame.

13. The device according to claim 12 wherein a magnitude of a displacement of the pivot frame from the neutral position towards said at least one deflected position is proportional to a strength of the magnetic field.

14. The device according to claim 13 further comprising a displacement sensor adapted to measure the magnitude of displacement of the pivot frame from the neutral position towards said at least one deflected position and processor arranged to determine the strength of the magnetic field based upon the magnitude of displacement of the pivot frame as measured by the sensor.

15. A field sensor device for sensing at least one of an electric field or a magnetic field, the device comprising:
   a base frame;
   a pivot frame supported on the base frame so as to be pivotal relative to the base frame about a pivot axis of the pivot frame between a neutral position and at least one deflected position;
   a first conductor and a second conductor supported on the pivot frame at diametrically opposing locations relative to the pivot axis of the pivot frame;
   an electrical controller operatively connected to the first conductor and the second conductor and being operable in either one of:
      (i) an electric field sensing mode in which the first conductor and the second conductor are electrically isolated from each other and are charged by the electrical controller with respective electrical charges which are opposed to one another such that the electrical charges induce rotational forces to urge rotation of the pivot frame relative to the base frame about the pivot axis away from the neutral position in a common direction of rotation in response to the electric field; and
      (ii) a magnetic field sensing mode in which the first conductor and the second conductor are in electrical communication with each other and receive an electrical current from the electrical controller passing therethrough in opposite directions relative to one another such that the electrical current induces rotational forces to urge rotation of the pivot frame relative to the base from about the pivot axis away from the neutral position in a common direction of rotation in response to the magnetic field; and
   an electrical switch operatively connected between the first and second conductors, the switch being operable between an open state in which the first and second conductors are electrically isolated from one another such that the electrical controller is operable in the electrical field sensing mode and a closed state in which the first and second conductors are electrically connected in series with one another such that the electrical controller is operable in the magnetic field sensing mode.

* * * * *